United States Patent
Toyota

(10) Patent No.: US 10,475,964 B2
(45) Date of Patent: Nov. 12, 2019

(54) METHOD OF PRODUCING N-TYPE OHMIC ELECTRODE AND N-TYPE OHMIC ELECTRODE, N-TYPE ELECTRODE, AND III NITRIDE SEMICONDUCTOR LIGHT-EMITTING DEVICE

(71) Applicant: DOWA Electronics Materials Co., Ltd., Chiyoda-ku, Tokyo (JP)

(72) Inventor: Tatsunori Toyota, Akita (JP)

(73) Assignee: DOWA Electronics Materials Co., Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 15/756,219

(22) PCT Filed: Sep. 2, 2016

(86) PCT No.: PCT/JP2016/004024
§ 371 (c)(1),
(2) Date: Feb. 28, 2018

(87) PCT Pub. No.: WO2017/038102
PCT Pub. Date: Mar. 9, 2017

(65) Prior Publication Data
US 2018/0248080 A1    Aug. 30, 2018

(30) Foreign Application Priority Data
Sep. 4, 2015 (JP) .................. 2015-174892

(51) Int. Cl.
*H01L 33/00* (2010.01)
*H01L 33/40* (2010.01)
(Continued)

(52) U.S. Cl.
CPC ............ *H01L 33/40* (2013.01); *C30B 23/025* (2013.01); *C30B 25/18* (2013.01); *C30B 25/183* (2013.01);
(Continued)

(58) Field of Classification Search
CPC ........ H01L 33/40; H01L 21/043; C30B 33/02
See application file for complete search history.

(56) References Cited

U.S. PATENT DOCUMENTS 6,420,740 B1 *  7/2002  Zhang ............... H01L 21/31604
                                                      257/295
2008/0210949 A1 *  9/2008  Makabe ............... H01L 29/205
                                                      257/76
(Continued)

FOREIGN PATENT DOCUMENTS

JP    2003309285 A    10/2003
JP    2004087908 A    3/2004
(Continued)

OTHER PUBLICATIONS

Mar. 6, 2018, International Preliminary Report on Patentability issued in the International Patent Application No. PCT/JP2016/004024.

(Continued)

*Primary Examiner* — Didarul A Mazumder
*Assistant Examiner* — Wasiul Haider
(74) *Attorney, Agent, or Firm* — Kenja IP Law PC

(57) ABSTRACT

Provided is a method of producing an n-type ohmic electrode that can form a good ohmic contact with an n-type $Al_xGa_{1-x}N$ (0.5≤x≤1) layer. The method of producing an n-type ohmic electrode includes: a first step of forming a first layer 11 made of one of Ti and Hf on a surface of a layer 30; a second step of forming a second layer 12 made of Sn on the surface of the first layer 11; a third step of forming a third layer 13 made of one of V and Mo on the surface of the second layer 12; a fourth step of forming a fourth layer 14 made of Al on the surface of the third layer 13; and a fifth step of performing heat treatment on the first layer 11, the second layer 12, the third layer 13, and the fourth layer 14.

6 Claims, 10 Drawing Sheets

(51) Int. Cl.
*C30B 23/02* (2006.01)
*C30B 25/18* (2006.01)
*C30B 29/02* (2006.01)
*C30B 29/40* (2006.01)
*C30B 33/02* (2006.01)
*H01L 33/32* (2010.01)

(52) U.S. Cl.
CPC ............ *C30B 29/02* (2013.01); *C30B 29/403* (2013.01); *C30B 29/406* (2013.01); *C30B 33/02* (2013.01); *H01L 33/32* (2013.01); *H01L 2933/0016* (2013.01)

(56) References Cited

U.S. PATENT DOCUMENTS

2011/0284908 A1* 11/2011 Muramoto .............. H01L 33/38
257/98

2013/0146922 A1* 6/2013 Kim ........................ A01H 5/02
257/98
2018/0212402 A1* 7/2018 Hamaguchi ............. H01S 5/183

FOREIGN PATENT DOCUMENTS

| | | |
|---|---|---|
| JP | 2004349595 A | 12/2004 |
| JP | 2008041866 A | 2/2008 |
| JP | 2008288548 A | 11/2008 |
| JP | 2010056459 A | 3/2010 |
| JP | 2013138093 A | 7/2013 |
| WO | 2009084325 A1 | 7/2009 |

OTHER PUBLICATIONS

Nov. 8, 2016, International Search Report issued in the International Patent Application No. PCT/JP2016/004024.

* cited by examiner

METHOD OF PRODUCING N-TYPE OHMIC ELECTRODE AND N-TYPE OHMIC ELECTRODE, N-TYPE ELECTRODE, AND III NITRIDE SEMICONDUCTOR LIGHT-EMITTING DEVICE

TECHNICAL FIELD

This disclosure relates to a method of producing an n-type ohmic electrode; and an n-type ohmic electrode, an n-type electrode, and a III nitride semiconductor light-emitting device. This disclosure relates in particular to a method of producing an n-type ohmic electrode that can form a good ohmic contact with an n-type $Al_xGa_{1-x}N$ ($0.5 \leq x \leq 1$) layer; and an n-type ohmic electrode, an n-type electrode, and a III nitride semiconductor light-emitting device.

BACKGROUND

Conventionally, a III-nitride semiconductors made of compounds in which N is combined with Group III elements such as Al, Ga, In, etc. are used as materials for light-emitting devices emitting blue to deep ultraviolet light. III-nitride semiconductors made of high-Al-content AlGaN are particularly used for ultraviolet light-emitting devices emitting light at a wavelength of 340 nm or less, or deep ultraviolet light light-emitting devices (DUV-LED) emitting light at a wavelength of 300 nm or less.

Here, with reference to FIG. 1, a III nitride semiconductor light-emitting device 100 having a typical lateral structure in conventional techniques will be described. The III nitride semiconductor light-emitting device 100 has a substrate 1, a buffer 2, an n-type III nitride semiconductor layer 3, a light emitting layer 4, and a p-type III nitride semiconductor layer 5 in this order. Subsequently, the light emitting layer 4 and the p-type III nitride semiconductor layer 5 are partially removed while the n-type III nitride semiconductor layer 3 is partly removed to provide an exposed portion. The removal is performed for example by etching. An n-type ohmic electrode 6a and a pad electrode 7a are sequentially formed on the surface of the exposed portion. Further, a p-type ohmic electrode 6b and a pad electrode 7b are also formed sequentially on the surface of the p-type III nitride semiconductor layer 5.

With respect to a III nitride semiconductor light-emitting device having such a lateral structure, JP 2003-309285 A (PTL 1) discloses a method of producing a Group III nitride compound semiconductor device having at least an n-type layer and a p-type layer on a substrate, wherein an n-electrode and a p-electrode are provided on a surface side of the device, the n-electrode is formed on a portion of the n-type layer exposed by etching, the p-type layer is doped with a p-type impurity, the resistance of the p-type layer is made low by irradiation with an electron beam, and an end face formed by etching after the electron beam irradiation is acidized.

Further, JP 2010-056459 A (PTL 2) discloses a method of producing a light-emitting device, comprising the steps of: forming, on a first main surface of a single crystal substrate of a III nitride semiconductor having the first main surface exhibiting Group-III polarity and a second main surface exhibiting N polarity, an optical semiconductor portion by stacking a first conductivity type III nitride semiconductor layer, a light emitting layer made of a III nitride semiconductor, and a second conductivity type III nitride semiconductor layer; forming a polarity reversing layer that converts N polarity into Group-III polarity on the second main surface by epitaxial growth; and forming a pyramidal III nitride semiconductor on the polarity reversing layer by epitaxial growth so that the crystal planes grown constitute the lateral faces of the pyramid.

CITATION LIST

Patent Literature

PTL 1: JP 2003-309285 A
PTL 2: JP 2010-056459 A

SUMMARY

Technical Problem

In both PTL 1 and PTL 2, n-type III nitride semiconductor layers used are layers formed of GaN doped with Si. Note that although PTL 1 describes that AlGaN, InGaN, or AlInGaN can be used instead of GaN, specific Al contents of those materials are not disclosed.

Here, of Group III elements, AlGaN having an Al content of 50% or more (hereinafter referred to as "$Al_xGa_{1-x}N$ ($0.5 \leq x \leq 1$)") has a larger band gap compared with GaN and accordingly has different properties from GaN. Therefore, techniques applicable to GaN cannot always be applied to $Al_xGa_{1-x}N$ ($0.5 \leq x \leq 1$). Accordingly, it is unclear whether conventionally known n-type ohmic electrodes as disclosed in PTLs 1 and 2 are compatible with a layer made of n-type $Al_xGa_{1-x}N$ ($0.5 \leq x \leq 1$).

In view of the above, we studied the compatibility and newly found that a good ohmic contact could not be achieved when a conventionally known n-type ohmic electrode was provided on a surface of an n-type $Al_xGa_{1-x}N$ ($0.5 \leq x \leq 1$) layer. To date, no n-type ohmic electrode that can form a good ohmic contact with an n-type $Al_xGa_{1-x}N$ ($0.5 \leq x \leq 1$) layer has not been established, and we newly realized the necessity of establishing an n-type ohmic electrode that is compatible with an n-type $Al_xGa_{1-x}N$ ($0.5 \leq x \leq 1$) layer. An establishment of n-type ohmic electrode that can form a good ohmic contact with an n-type $Al_xGa_{1-x}N$ ($0.5 \leq x \leq 1$) layer is expected to lead to higher output of an ultraviolet light-emitting device and a deep ultraviolet light-emitting device which use a III nitride semiconductor having a high Al content.

It could therefore be helpful to provide a method of producing an n-type ohmic electrode that can form a good ohmic contact with an n-type $Al_xGa_{1-x}N$ ($0.5 \leq x \leq 1$) layer. It could also be helpful to provide an n-type ohmic electrode that can form a good ohmic contact with an n-type $Al_xGa_{1-x}N$ ($0.5 \leq x \leq 1$) layer, and an n-type electrode and a III nitride semiconductor light-emitting device which use the n-type ohmic electrode.

Solution to Problem

We diligently studied ways to address the above challenges. When forming an n-type ohmic electrode made of an alloy, we focused on the layer structure of the electrode and metal elements of the layers of the electrode. Further, we found it possible to produce an n-type ohmic electrode that can form a good ohmic contact with an n-type $Al_xGa_{1-x}N$ ($0.5 \leq x \leq 1$) layer by sequentially forming metal layers made of suitable metal elements. This discovery led to this disclosure.

Specifically, we propose the following features.

(1) A method of producing an n-type ohmic electrode, comprising: a first step of a first metal layer made of one of Ti and Hf on a surface of an n-type $Al_xGa_{1-x}N$ (0.5≤x≤1) layer; a second step of forming a second metal layer made of Sn on a surface of the first metal layer; a third step of forming a third metal layer made of one of V and Mo on a surface of the second metal layer; a fourth step of forming a fourth metal layer made of Al on a surface of the third metal layer; and a fifth step of performing heat treatment on the first metal layer, the second metal layer, the third metal layer, and the fourth metal layer.

(2) The method of producing an n-type ohmic electrode, according to (1) above, wherein the heat treatment in the fifth step is performed at 450° C. or more and 600° C. or less.

(3) An n-type ohmic electrode provided in contact with an n-type $Al_xGa_{1-x}N$ (0.5≤x≤1) layer, comprising an alloy including: a first element made of one of Ti and Hf; a second element made of Sn; a third element made of one of V and Mo; and a fourth element made of Al.

(4) An n-type electrode comprising the n-type ohmic electrode according to (3) above and a pad electrode at least provided on the n-type ohmic electrode, wherein the n-type electrode is sectioned into a contact region and a bonding region other than the contact region, part of the pad electrode in the contact region is provided on the n-type $Al_xGa_{1-x}N$ (0.5≤x≤1) layer with the n-type ohmic electrode therebetween, and part of the pad electrode in the bonding region is provided on the n-type $Al_xGa_{1-x}N$ (0.5≤x≤1) layer without the n-type ohmic electrode therebetween.

(5) A III nitride semiconductor light-emitting device comprising the n-type electrode according to (4) above.

Advantageous Effect

According to this disclosure, metal layers made of suitable metal elements are sequentially formed, which makes it possible to provide a method of producing an n-type ohmic electrode that can form a good ohmic contact with an n-type $Al_xGa_{1-x}N$ (0.5≤x≤1) layer. Further, an n-type ohmic electrode that can form a good ohmic contact, and an n-type electrode and a III nitride semiconductor light-emitting device which use the n-type ohmic electrode can also be provided.

BRIEF DESCRIPTION OF THE DRAWINGS

In the accompanying drawings:

FIGS. 3A and 3B are schematic views of an n-type electrode according to one embodiment of this disclosure, in which FIG. 3A is a perspective view and FIG. 3B is a cross-sectional view corresponding to FIG. 3A;

FIGS. 4A and 4B are schematic views of an n-type electrode according to a variation of one embodiment of this disclosure, in which FIG. 4A is a perspective view and FIG. 4B is a cross-sectional view corresponding to FIG. 4A;

FIGS. 5A and 5B are schematic cross-sectional views of n-type electrodes, in which FIG. 5A is a schematic cross-sectional view in accordance with another embodiment of this disclosure, and FIG. 5B is a schematic cross-sectional view in accordance with still another embodiment of this disclosure;

DETAILED DESCRIPTION

Figure 1:
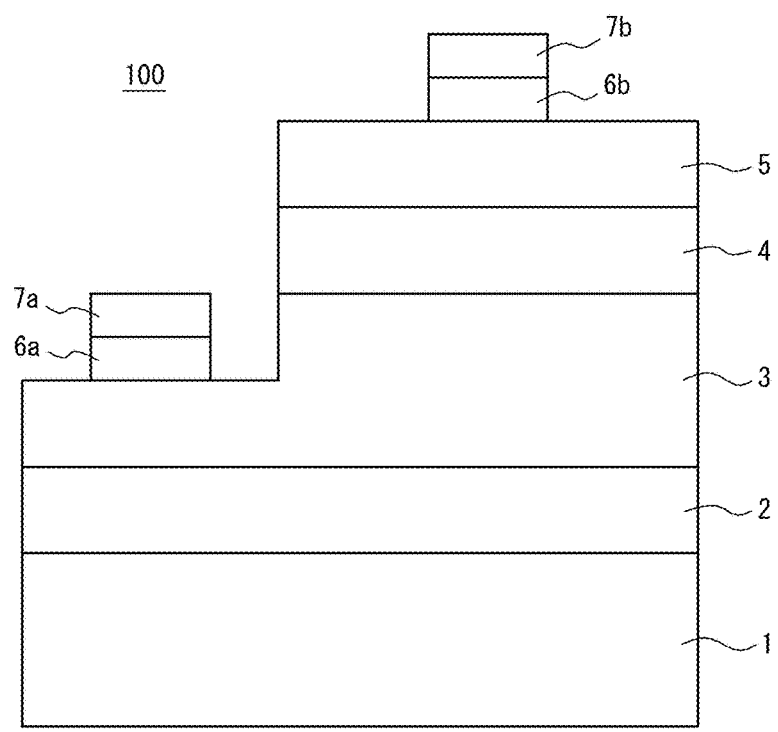
FIG. 1 is a schematic cross-sectional view illustrating a typical III nitride semiconductor light-emitting device in accordance with conventional techniques.

Embodiments of this disclosure will now be described with reference to the drawings. In principle, like components are denoted by like reference numerals, and the description of those components will not be repeated. In FIGS. 2 to 5B, the layers are exaggerated for convenience of description, so that their aspect ratios do not conform to the actual ratios.

(Method of Producing n-Type Ohmic Electrode)

A method of producing an n-type ohmic electrode 10 according to one embodiment of this disclosure will be described with reference to the process diagram of FIG. 2. The method of this embodiment includes: a first step of forming a first metal layer 11 made of one of Ti and Hf on a surface of an n-type $Al_xGa_{1-x}N$ layer 30, where x satisfies 0.5≤x≤1 (Step A in FIG. 2); a second step of forming a second metal layer 12 made of Sn on the surface of the first metal layer 11 (Step B in FIG. 2); a third step of forming a third metal layer 13 made of one of V and Mo on the surface of the second metal layer 12 (Step C in FIG. 2); a fourth step of forming a fourth metal layer 14 made of Al on the surface of the third metal layer 13 (Step D in FIG. 2); and a fifth step of performing heat treatment on the first metal layer 11, the second metal layer 12, the third metal layer 13, and the fourth metal layer 14 (Step E in FIG. 2). Details of the structures and steps will now be sequentially described. Note that "$Al_xGa_{1-x}N$ layer, where x satisfies 0.5≤x≤1" is hereinafter referred to as "$Al_xGa_{1-x}N$ (0.5≤x≤1) layer".

First, the n-type $Al_xGa_{1-x}N$ (0.5≤x≤1) layer 30 is described. The n-type $Al_xGa_{1-x}N$ (0.5≤x≤1) layer 30 is not limited as long as it is a layer serving as an n-type semiconductor made of AlGaN having an Al content of 50% or more. Examples of n-type dopants (impurities) include, but not limited to, Si, Ge, Sn, S, O, Ti, and Zr. Addition of any one of these n-type dopants allows for a good ohmic contact with the n-type ohmic electrode produced in accordance with this embodiment. Further, the dopant concentration is also not limited in particular as long as n-type characteristics can be achieved, and the dopant concentration is for example $1.0 \times 10^{18}$ atoms/cm$^3$ to $1.0 \times 10^{20}$ atoms/cm$^3$. Further, when a plurality of layers having different Al contents constitute an n-type III nitride semiconductor layer, its outermost surface to be in contact with the first metal layer 11 is constituted by the n-type $Al_xGa_{1-x}N$ (0.5≤x≤1) layer 30.

In the first step (Step A in FIG. 2), the first metal layer 11 made of one of Ti and Hf is formed on a surface of the n-type $Al_xGa_{1-x}N$ (0.5≤x≤1) layer 30. One of Ti and Hf is used for the first metal layer 11 because Ti and Hf are high melting point materials which are adhesive to the n-type layer 30. The thickness of the first metal layer is preferably, but not limited to, 0.5 nm or more and 10 nm or less, more preferably, 1.0 nm or more and 5.0 nm or less. When the thickness of the first metal layer 11 is 1.0 nm or more, sufficient bonding strength for bonding with the n-type $Al_xGa_{1-x}N$ ($0.5 \leq x \leq 1$) layer 30 can be achieved; when the thickness is 5.0 nm or less, an ohmic contact is ensured. Note that in view of the production cost, the first metal layer 11 is preferably made of Ti.

In the subsequent second step, the second metal layer 12 made of Sn is formed on the surface of the first metal layer 11. When Sn which is a low melting point material is used for the second metal layer 12, the diffusion Sn ensures ohmic characteristics with the n-type layer. The thickness of the second metal layer 12 is preferably, but not limited to, 5.0 nm or more and 30 nm or less, more preferably 7.0 nm or more 20 nm or less, particularly preferably 8.0 nm or more and 15 nm or less. When the thickness of the second metal layer 12 is set to be within the aforementioned range, the above effects can be ensured and the resistance can be prevented from increasing.

Next, in the third step, the third metal layer 13 made of one of V and M is formed on the surface of the second metal layer 12. One of V and Mo is used for the third metal layer 13 because V and Mo are high melting point materials and they can suppress diffusion of Sn used for the second metal layer 12 to the outermost surface and also improve the hardness of the n-type ohmic electrode to be obtained. The thickness of the third metal layer 13 is not limited as long as the above effects can be achieved, and is preferably 5.0 nm or more and 30 nm or less, more preferably 8.0 nm or more 25 nm or less, particularly preferably 10 nm or more and 20 nm or less. A thickness of the third metal layer 13 being 5.0 nm or more ensures the above effects, and a thickness of 30 nm or less prevents the resistance from increasing.

In the fourth step, the fourth metal layer 14 made of Al is formed on the surface of the third metal layer 13. Al is used for the fourth metal layer 14 so as to ensure the ohmic characteristics with the n-type layer due to the interdiffusion with Sn used for the second metal layer 12. The thickness of the fourth metal layer 14 is preferably, but not limited to, 100 nm or more and 300 nm or less, more preferably 150 nm or more and 250 nm or less, particularly preferably 180 nm or more and 240 nm or less. When the thickness of the fourth metal layer 14 is 100 nm or more and 300 nm or less, the above effects can be ensured.

Note that a common technique can be used to form the metal layers in the first step to the fourth step. Although not illustrated, films made of the respective components of the first metal layer 11, the second metal layer 12, the third metal layer 13, and the fourth metal layer 14 can be sequentially formed for example by electron beam evaporation, resistance heating evaporation, sputtering, or the like. Note that before or after the fifth step, photolithography may be performed to form a predetermined pattern on a laminate constituted by the first metal layer 11 to the fourth metal layer 14 (or the n-type ohmic electrode 10 obtained after alloying). In the photolithography, a resist pattern is formed and then exposed to light, followed by etching to remove the remaining resist. Note that the shape and size of the laminate constituted by the first metal layer 11 to the fourth metal layer 14 can be determined depending on use. Further, the thickness of each metal layer can be controlled based on the film formation rate of each metal layer previously measured using a stylus step profiler.

Finally, in the fifth step, the first metal layer 11, the second metal layer 12, the third metal layer 13, and the fourth metal layer 14 (i.e., the above laminate) was subjected to heat treatment, thereby obtaining the n-type ohmic electrode 10. Although depending on the kinds of the metal elements forming the first metal layer 11 to the fourth metal layer 14 and the thickness of each layer, typical heat treatment conditions can be used in this step. For example, heat treatment can be performed at a temperature in a range of 400° C. or more and 700° C. or less in an Ar gas atmosphere. The n-type ohmic electrode 10 obtained through the above steps is obtained by alloying the constituent elements of the first metal layer 11, the second metal layer 12, the third metal layer 13, and the fourth metal layer 14. The n-type ohmic electrode 10 produced through the above steps can form a good ohmic contact with the n-type $Al_xGa_{1-x}N$ ($0.5 \leq x \leq 1$) layer.

Note that as described above, the range of the temperature of the heat treatment in the fifth step is preferably, but not limited to, 450° C. or more and 650° C. or less, more preferably 600° C. or less. In this embodiment, when alloying to obtain the n-type ohmic electrode, even under relatively low temperature heat treatment conditions, in which the lower limit of the temperature range of heat treatment is as low as for example 450° C., the n-type ohmic electrode 10 which can form a good ohmic contact with the n-type $Al_xGa_{1-x}N$ ($0.5 \leq x \leq 1$) layer can be obtained. The Ar atmosphere gas here is only an example, and nitrogen gas or the like can also be used as the ambient gas. Alternatively, heat treatment can be performed in vacuum. Note however that an atmosphere of Ar gas which is an inert gas is preferred. Further, within the temperature range of heat treatment in this embodiment, a relatively low heat treatment temperature range in forming the p-type ohmic electrode and the heat treatment temperature range in forming the n-type ohmic electrode overlap, so that the electrodes can simultaneously be subjected to contact annealing, leading to a simpler process.

Further, while the thicknesses of the first metal layer 11, the second metal layer 12, the third metal layer 13, and the fourth metal layer 14 are as described above, the total of these thicknesses is preferably 150 nm or more and 300 nm or less, more preferably 200 nm or more and 250 nm or less. The total thickness within the range ensures an ohmic contact with the n-type AlGaN layer.

A pad electrode is formed on a surface of the n-type ohmic electrode 10; thus, an n-type electrode can be formed. The material of the pad electrode used may be, but not limited to, one or more metal elements selected from the group consisting of Ti, Cr, W, Ni, Pt, and Au. Alternatively, an alloy formed from two or more metals selected from the above-mentioned group can be used, or a laminated body composed of two or more metals selected from the group can be used. For example, a three-layer structure in which Ti, Pt, and Au are stacked in this order can be used as the pad electrode on the surface of the n-type ohmic electrode 10. Also in forming the pad electrode, sputtering, electron beam evaporation, resistance heating evaporation, or the like can be used.

(N-Type Ohmic Electrode)

Figure 2:
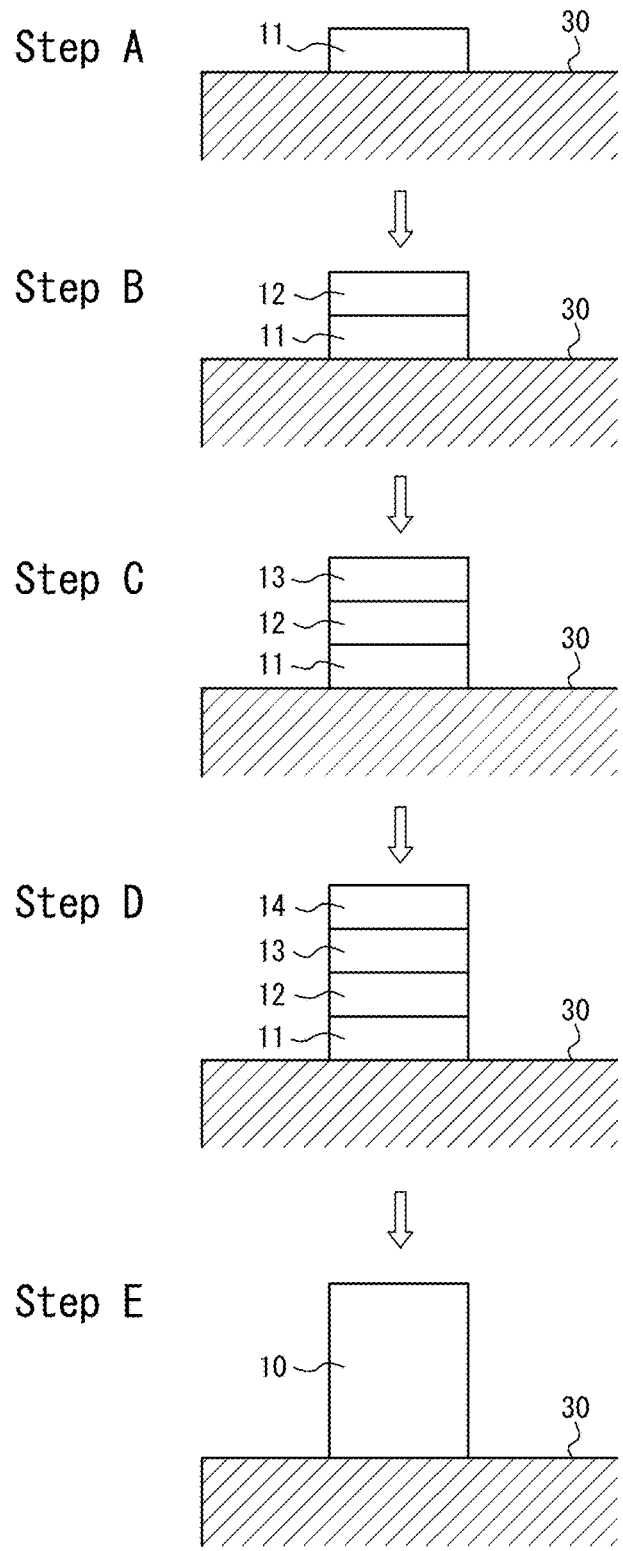
FIG. 2 is a process diagram illustrating Steps A to E of a method of producing an n-type ohmic electrode according to one embodiment of this disclosure.

As illustrated as Step E in FIG. 2, the n-type ohmic electrode 10 provided in contact with the n-type $Al_xGa_{1-x}N$ ($0.5 \leq x \leq 1$) layer 30, in accordance with one embodiment of this disclosure is formed of an alloy composed of a first element made of one of Ti and Hf, a second element made of Sn, a third element made of one of V and Mo, and a fourth element made of Al. The n-type ohmic electrode 10 can be produced in accordance with the foregoing embodiment of the method of producing the n-type ohmic electrode 10. Of course, an n-type ohmic electrode 10 produced by another method is also covered by the present invention. Note that the inclusion of the above first to fourth elements can be determined by depth profiling of the n-type ohmic electrode 10 using Auger electron spectroscopy (AES).

Here, bumps are irregularly scattered on the surface of the n-type ohmic electrode 10 (see Reference Experimental Examples described below). This state increases the surface area of the portion where the n-type ohmic electrode 10 contacts a pad electrode 20 formed thereon and is therefore preferred in terms of achieving an ohmic contact. However, when a bonding region is formed to be connected to the outside atop the irregular bumps, these bumps would result in a poor contact in bonding. Therefore, it is preferable that the bonding region is not provided on the n-type ohmic electrode 10. Accordingly, an n-type electrode to be described below is preferred.

(N-Type Electrode)

As illustratively depicted in FIGS. 3A to 5B, an n-type electrode 80 according to this disclosure includes the above-described n-type ohmic electrode 10 and the pad electrode 20 at least provided on the n-type ohmic electrode 10. The n-type electrode 80 is sectioned into a contact region C and a bonding region B other than the contact region C. Part of the pad electrode 20 in the contact region C is provided on the n-type $Al_xGa_{1-x}N$ ($0.5 \leq x \leq 1$) layer 30 with the n-type ohmic electrode 10 therebetween. Further, part of the pad electrode 20 in the contact region B is provided on the n-type $Al_xGa_{1-x}N$ ($0.5 \leq x \leq 1$) layer 30 without the n-type ohmic electrode 10 therebetween.

Figure 3A:
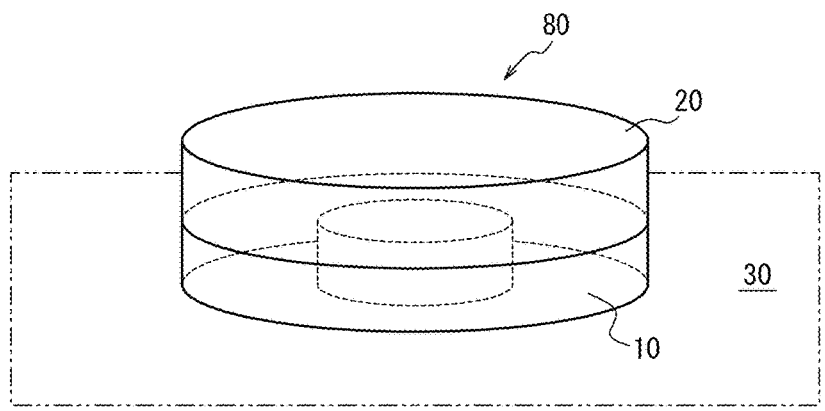
Figure 3B:
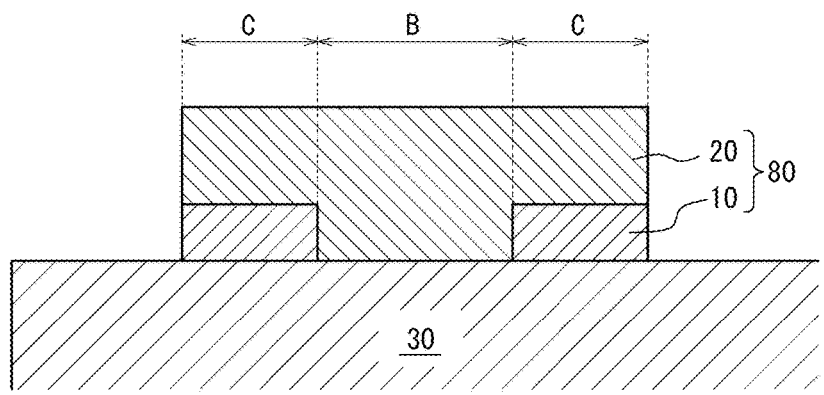

One embodiment of such an n-type electrode 80 is illustrated in FIGS. 3A and 3B. The n-type ohmic electrode 10 having a hollow circular cylindrical shape is provided on the n-type $Al_xGa_{1-x}N$ ($0.5 \leq x \leq 1$) layer 30, and the pad electrode 20 is provided on the n-type ohmic electrode 10 to fill the hollow space in the n-type ohmic electrode 10. In this case, the contact region C of the n-type electrode 80 covers the n-type ohmic electrode 10, and the bonding region B of the n-type electrode 80 covers the hollow space (on the n-type $Al_xGa_{1-x}N$ ($0.5 \leq x \leq 1$) layer 30, where the n-type ohmic electrode 10 is not provided). The bonding region B of this circular cylindrical n-type electrode 80 is preferably subjected to wire bonding, which can avoid poor contact in bonding. Note that the illustrated hollow circular cylindrical n-type ohmic electrode 10 is only an example, and the electrode can have a variety of shapes as long as it has a hollow space, and such an electrode can have the same effects.

Figure 4A:
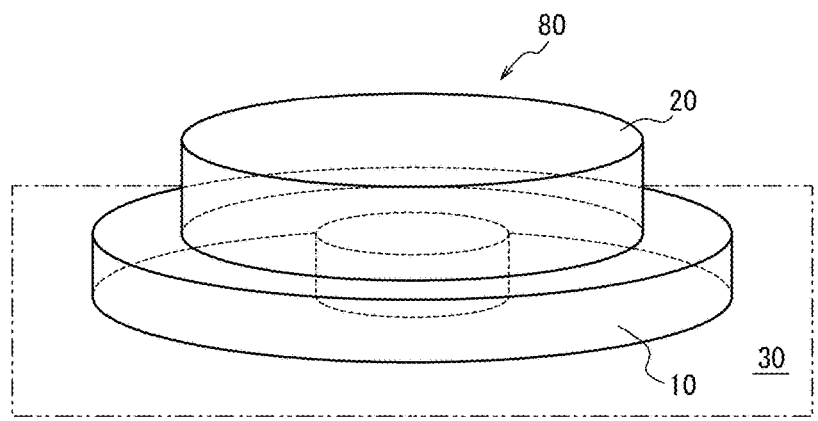
Figure 4B:
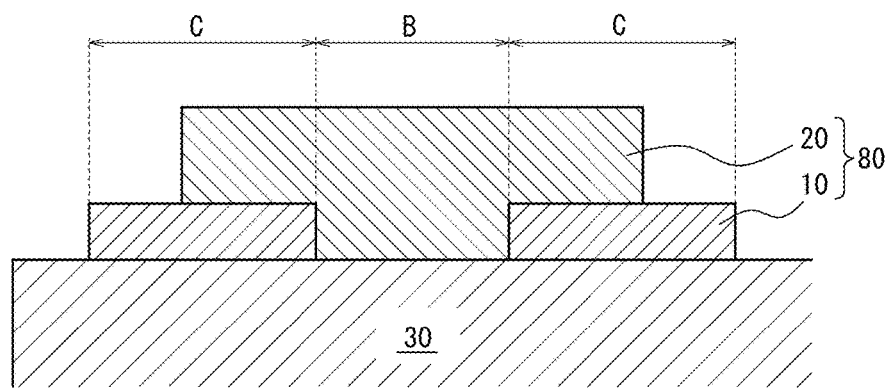

The hollow circular cylindrical n-type ohmic electrode 10 of the n-type electrode 80 according to a variation of this embodiment is provided on the n-type $Al_xGa_{1-x}N$ ($0.5 \leq x \leq 1$) layer 30 as illustrated in FIGS. 4A and 4B. The pad electrode 20 fills the hollow space of the n-type ohmic electrode 10, and the diameter of the pad electrode 20 is larger than the inner diameter of the n-type ohmic electrode 10 and smaller than the outer diameter thereof. The n-type electrode 80 according to this variation can also avoid poor contact in bonding as in the above-described embodiment of FIGS. 3A and 3B.

Figure 5A:
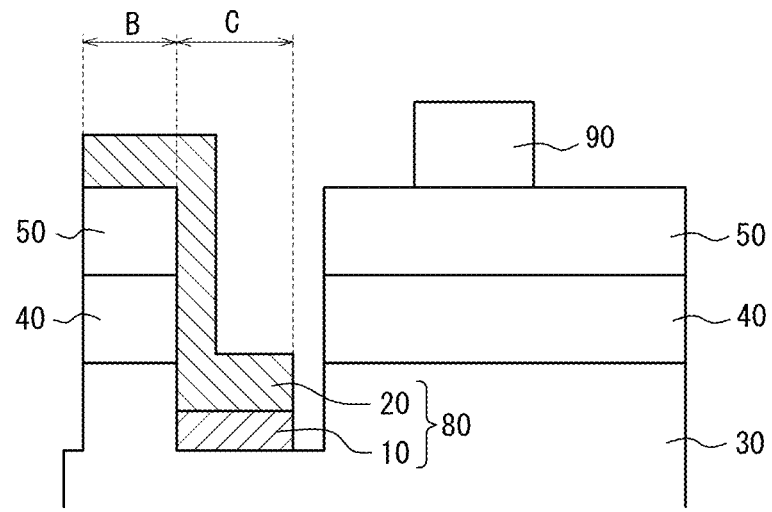
Figure 5B:
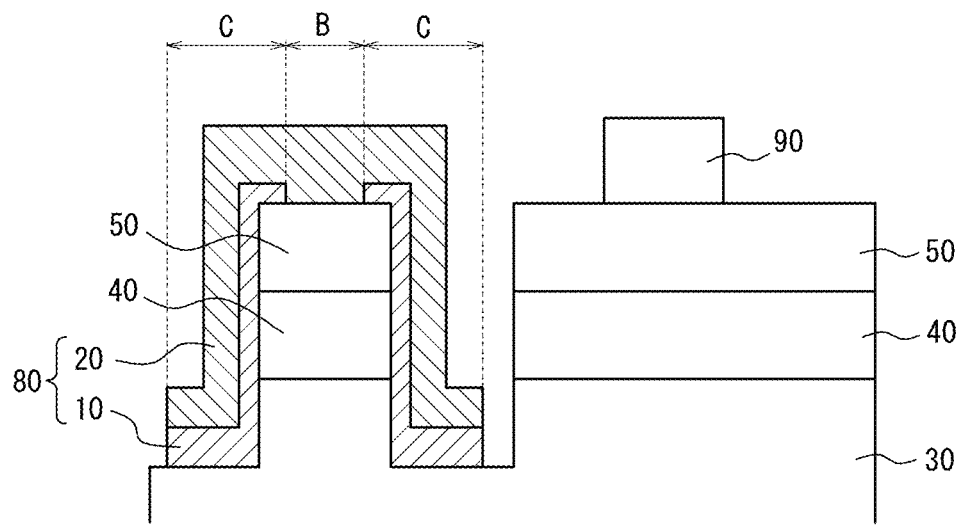
Figure 6A:
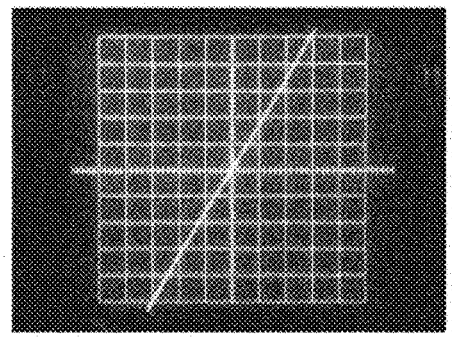
FIGS. 6A to 6E are graphs representing the I-V characteristics in Example 1.
Figure 6B:
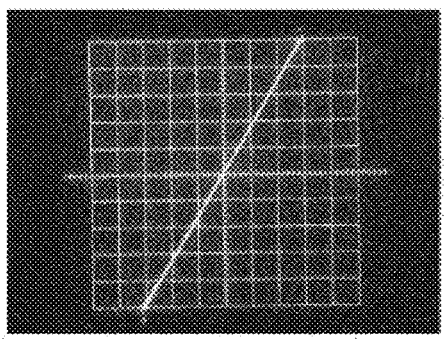
Figure 6C:
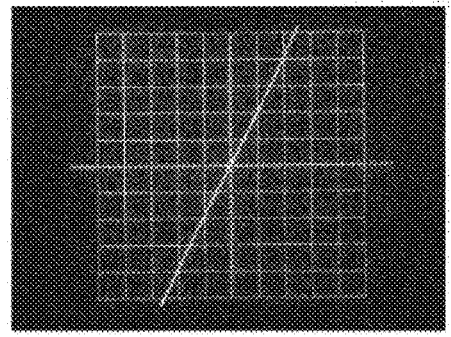
Figure 6D:
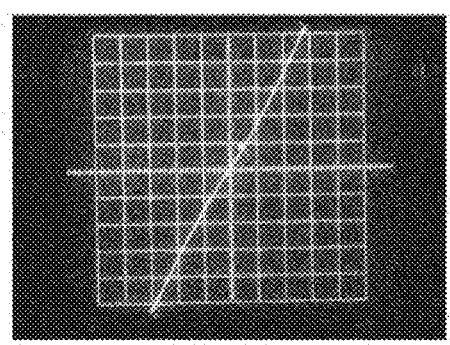
Figure 6E:
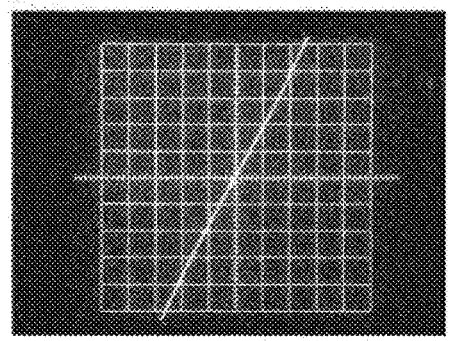
Figure 7A:
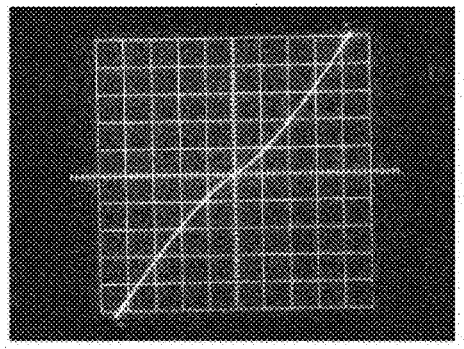
FIGS. 7A to 7E are graphs representing the I-V characteristics in Example 2.
Figure 7B:
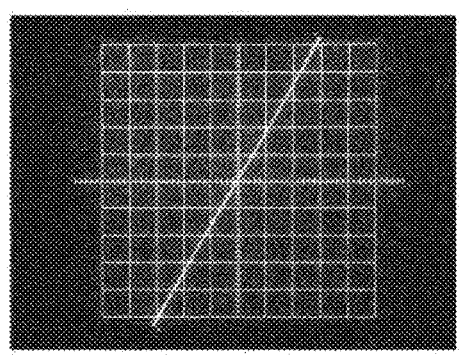
Figure 7C:
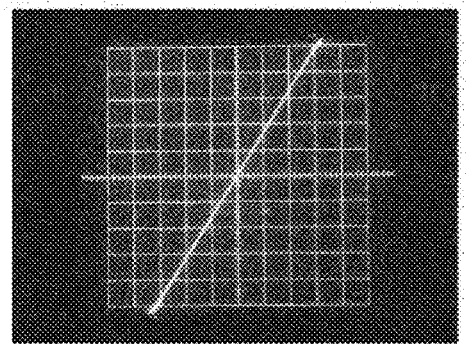
Figure 7D:
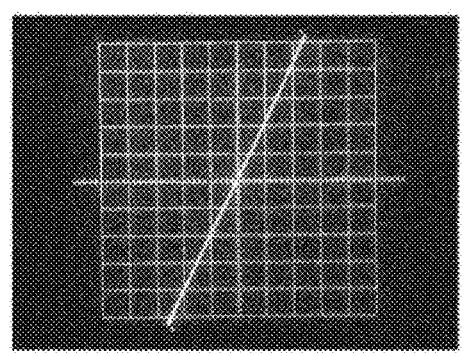
Figure 7E:
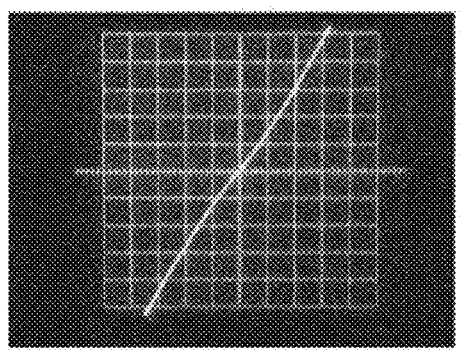
Figure 8A:
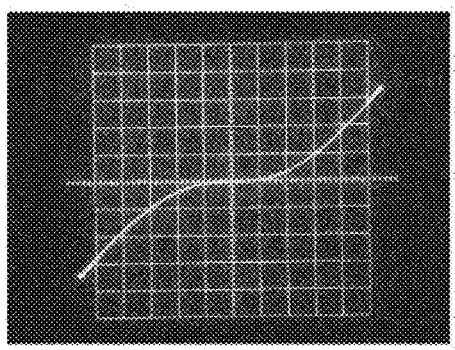
FIGS. 8A to 8E are graphs representing the I-V characteristics in Example 3.
Figure 8B:
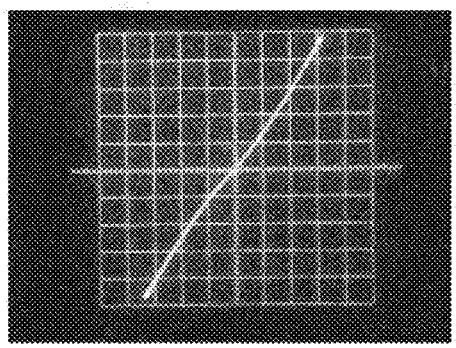
Figure 8C:
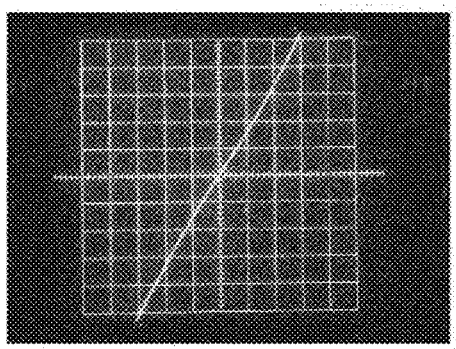
Figure 8D:
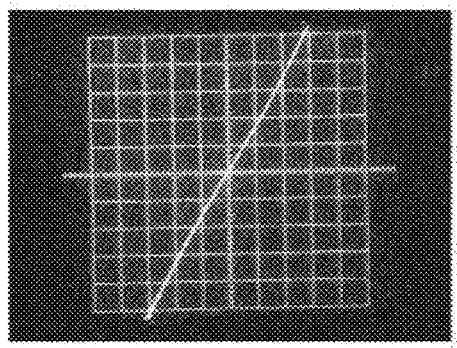
Figure 8E:
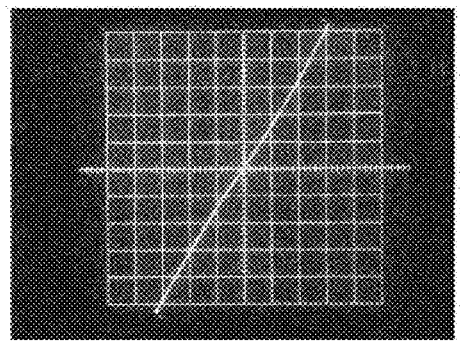

The n-type electrode 80 is not limited to the above embodiment. As illustrated in FIGS. 5A and 5B, after forming the n-type $Al_xGa_{1-x}N$ ($0.5 \leq x \leq 1$) layer 30, a light emitting layer 40, and a p-type semiconductor layer 50, the layers are partly etched to expose part of the n-type $Al_xGa_{1-x}N$ ($0.5 \leq x \leq 1$) layer 30 and a groove is formed. A p-type electrode 90 is provided on the p-type semiconductor layer 50.

In another embodiment illustrated in FIG. 5A, the n-type ohmic electrode 10 is provided on part of the groove to be thinner than the protruded portions of the n-type $Al_xGa_{1-x}N$ ($0.5 \leq x \leq 1$) layer 30. Further, the pad electrode 20 is provided to cover a layered structure composed of the n-type $Al_xGa_{1-x}N$ ($0.5 \leq x \leq 1$) layer 30, the light emitting layer 40, and the p-type semiconductor layer 50 in the diagram on the left of the drawing (that is, on the side where the p-type electrode 90 is not provided). In this case, the bonding region B is on the p-type semiconductor layer 50 of the layered structure. The bonding region B does not cover the n-type ohmic electrode 10, so that the influence of the irregular bumps can be avoided, which is preferable. The n-type ohmic electrode 10 and the pad electrode 20 are electrically connected to each other above the area provided with the n-type ohmic electrode 10. The portions of the electrodes on the area constitute the contact region C. Thus, the n-type electrode illustrated in FIG. 5A can also avoid the influence of the irregular bumps, preventing poor contact in bonding, which is preferable.

Further, in another embodiment illustrated in FIG. 5B, a layered structure similar to one in FIG. 5A is formed, and the n-type ohmic electrode 10 covers the layered structure except for the top center part. The pad electrode 20 is provided to cover the n-type ohmic electrode 10 as well as the above layered structure. The portion of the n-type electrode 80 on the p-type semiconductor layer 50 of the layered structure, where the n-type ohmic electrode 10 is not provided, constitutes the bonding region B, which prevents the influence of the irregular bumps. The portion of the n-type electrode 80 on the area provided with the n-type ohmic electrode 10 constitutes the contact region C.

(III Nitride Semiconductor Light-Emitting Device)

Further, a III nitride semiconductor light-emitting device according to this disclosure has the aforementioned n-type electrode 80, can form a good ohmic contact with an n-type $Al_xGa_{1-x}N$ ($0.5 \leq x \leq 1$) layer, and has excellent light output power.

Although the embodiments of this disclosure have been described above, the embodiments are illustrated only as representative examples, and therefore this disclosure is not limited thereto and may be changed in various manners within the spirit of this disclosure. For example, the III nitride semiconductor light-emitting device 100 having a lateral structure has been described; however, the applications of n-type ohmic electrodes and n-type electrodes according to this disclosure are not limited to the applications to lateral III nitride semiconductor light-emitting devices, and they can suitably be used with any given n-type $Al_xGa_{1-x}N$ ($0.5 \leq x \leq 1$) layers to achieve a good ohmic contact.

EXAMPLES

Experimental Examples 1

Example 1

A sapphire substrate (diameter: 2 in, thickness: 430 μm, crystallographic plane: (0001); corresponding to the substrate 1 in FIG. 1) was prepared. Subsequently, an AlN layer having a thickness of 0.60 μm was grown as a buffer on the sapphire substrate by MOCVD (corresponding to the buffer 2 in FIG. 1), thus obtaining an AlN template substrate. Using this AlN template substrate, an undoped $Al_{0.7}Ga_{0.3}N$ layer (thickness: 1 μm) was formed by MOCVD, and a 2.4 μm thick n-type $Al_{0.62}Ga_{0.38}N$ layer doped with Si (corresponding to part of the n-type III nitride semiconductor layer 3 in FIG. 1) was then formed on the $Al_{0.7}Ga_{0.3}N$ layer.

Using electron beam (EB) evaporation, a first metal layer made of Ti with a thickness of 2.0 nm, a second metal layer made of Sn with a thickness of 10 nm, a third metal layer made of V with a thickness of 10 nm, and a fourth metal layer made of Al with a thickness of 200 nm were sequentially formed on the n-type $Al_{0.62}Ga_{0.38}N$ layer. Finally, contact annealing was performed in which heating was performed at 1.5° C./s and the temperature was retained at 450° C., 500° C., 550° C., 600° C., and 650° C. in an Ar atmosphere each for 600 s, followed by rapid cooling, thereby forming an n-type ohmic electrode.

Finally, Ti with a thickness of 50 nm, Pt with a thickness of 50 nm, and Au with a thickness of 700 nm were sequentially deposited on a surface of the n-type ohmic electrode by sputtering to form an electrode, thus obtaining the n-type electrode according to Example 1.

Example 2

An n-type electrode according to Example 2 was formed in the same manner as in Example 1 except that the third metal layer made of V with a thickness of 10 nm in Example 1 was replaced by a third metal layer made of Mo with a thickness of 20 nm.

Example 3

An n-type electrode according to Example 3 was formed in the same manner as in Example 1 except that the first metal layer made of Ti with a thickness of 2.0 nm and the third metal layer made of V with a thickness of 10 nm in Example 1 were replaced by a first metal layer made of Hf with a thickness of 5.0 nm and a third metal layer made of V with a thickness of 20 nm, respectively.

Comparative Example 1

An n-type electrode according to Comparative Example 1 was formed in the same manner as in Example 1 except that the first metal layer made of Ti with a thickness of 2.0 nm in Example 1 was replaced by a first metal layer made of Ti with a thickness of 20 nm, and the second metal layer and the third metal layer were not formed. Note that the temperatures retained in the contact annealing were 550° C., 600° C., and 650° C. only.

Example 4

An n-type electrode according to Example 4 was formed under the same conditions as in Example 1 except that the n-type electrode in Example 1 was formed on an n-type $Al_{0.56}Ga_{0.44}N$ layer.

Comparative Example 2

An n-type electrode according to Comparative Example 2 was formed under the same conditions as in Comparative Example 1 except that the n-type electrode in Comparative Example 1 was formed on an n-type $Al_{0.56}Ga_{0.44}N$ layer.

Conventional Example 1

An n-type electrode according to Conventional Example 1 was formed under the same conditions as in Comparative Example 1 except that the n-type electrode in Comparative Example 1 was formed on an n-type GaN layer (i.e., AlGaN having an Al content of 0%).

(Evaluation 1: Measurement of I-V Characteristics)

Each n-type electrode of Examples 1 to 4, Comparative Examples 1 to 2, and Conventional Example 1 above was provided with an electrode pattern (shape: square with sides of 120 μm, distance between electrodes: 250 μm) and subjected to measurements of I-V characteristics (current-voltage characteristics) using a probe and a IV measurement system (curve tracer). The straight lines and curves of the I-V characteristics obtained were evaluated based on the following criteria. The results are presented in Table 1 with the conditions for forming the n-type ohmic electrodes of Examples 1 to 4 and Comparative Examples 1 to 2. "N/A" indicates that the evaluation was not performed. Further, in Conventional Example 1, a good ohmic contact was observed for any heat treatment temperature.

++: Straight line shape—a good ohmic was achieved.

+: Although the line has an inflection point at the origin, no part of the tangent line has a gradient of 0—an ohmic contact was substantially achieved.

−: The line has an inflection point at the origin and the tangent line partly has a gradient of 0—an ohmic contact was not achieved.

Figure 9A:
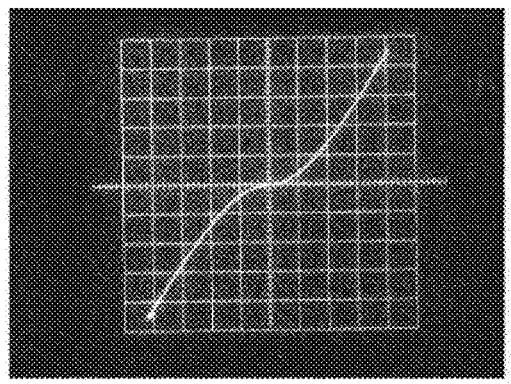
FIGS. 9A to 9C are graphs representing the I-V characteristics in Comparative Example 1.
Figure 9B:
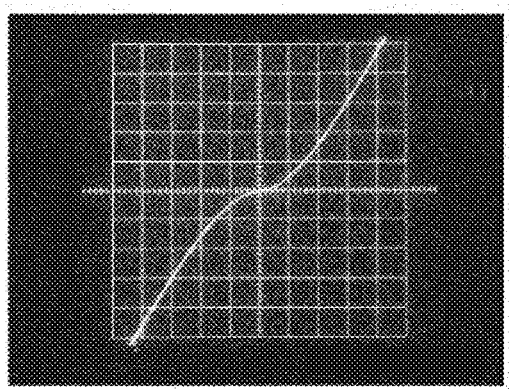
Figure 9C:
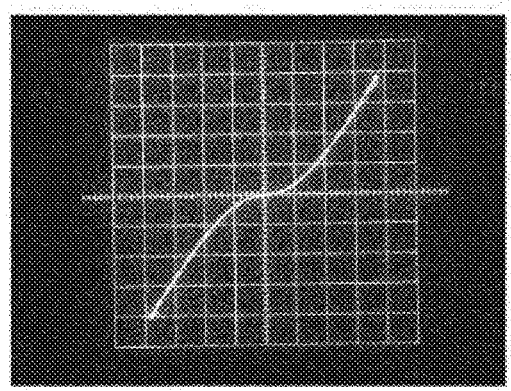

As representative examples, the graphs illustrating the measurement results of the I-V characteristics in Examples 1 to 3 and Comparative Example 1 are presented in FIGS. 6A to 9C. In FIGS. 6A to 8E, A to E correspond to the heat treatment temperatures 450° C., 500° C., 550° C., 600° C., and 650° C., respectively. FIGS. 9A to 9C correspond to 550° C., 600° C., and 650° C., respectively.

TABLE 1

|  | 1st metal layer | 2nd metal layer | 3rd metal layer | 4th metal layer | Heat treatment temperature | | | | |
|---|---|---|---|---|---|---|---|---|---|
|  |  |  |  |  | 450° C. | 500° C. | 550° C. | 600° C. | 650° C. |
| Example 1 | Ti (2.0 nm) | Sn (10 nm) | V (10 nm) | Al (200 nm) | ++ | ++ | ++ | ++ | ++ |
| Example 2 | Ti (2.0 nm) | Sn (10 nm) | Mo (20 nm) | Al (200 nm) | + | ++ | ++ | ++ | + |
| Example 3 | Hf (5.0 nm) | Sn (10 nm) | V (20 nm) | Al (200 nm) | − | + | ++ | ++ | ++ |
| Comparative Example 1 | Ti (20 nm) | N/A | N/A | Al (200 nm) | N/A | N/A | − | − | − |
| Example 4 | Ti (2.0 nm) | Sn (10 nm) | V (10 nm) | Al (200 nm) | ++ | ++ | ++ | ++ | ++ |
| Comparative Example 2 | Ti (20 nm) | N/A | N/A | Al (200 nm) | N/A | N/A | − | − | − |

Evaluation 1 led to the following findings.

First, Comparative Examples 1 and 2 and Conventional Example 1 demonstrated that an n-type electrode that can form an ohmic contact with an n-type GaN layer cannot necessarily form an ohmic contact with an n-type $Al_xGa_{1-x}N$ ($0.5 \leq x \leq 1$) layer.

Next, Examples 1 to 4 in accordance with the conditions of this disclosure demonstrated that an n-type electrode can form an ohmic contact with an n-type $Al_xGa_{1-x}N$ ($0.5 \leq x \leq 1$) layer. When Ti was used for the first metal layer and V was used for the third metal layer, a good ohmic contact was found to be formed even under a low temperature heat treatment condition of 450° C. Further, a heat treatment temperature range set to be 550° C. or more and 600° C. or less was found to ensure an ohmic contact.

Experimental Example 2

Example 5

Subsequent to the formation of the n-type $Al_{0.62}Ga_{0.38}N$ layer in Example 1, a light emitting layer (corresponding to the light emitting layer 4 in FIG. 1) was formed by forming an n-type $Al_{0.62}Ga_{0.44}N$ layer and alternately stacking 3.5 pairs of well layers made of $Al_{0.45}Ga_{0.55}N$ with a thickness of 3 nm and barrier layers made of $Al_{0.65}Ga_{0.35}N$ with a thickness of 7 nm on the n-type $Al_{0.62}Ga_{0.44}N$ layer.

After that, a p-type blocking layer made of $Al_{0.68}Ga_{0.32}N$ doped with Mg with a thickness of 40 nm (corresponding to part of the p-type III nitride semiconductor layer 5 in FIG. 1) was formed on the light emitting layer, and a p-type contact layer made of GaN doped with Mg with a thickness of 10 nm (corresponding to the p-type III nitride semiconductor layer 5 in FIG. 1) was then formed.

Further, a mask was formed on the p-type contact layer and etching was performed by mesa etching using dry etching to expose part of the n-type $Al_{0.62}Ga_{0.38}N$ layer. Next, a p-type ohmic electrode made of Ni (5 nm)/Au (50 nm) was formed on the p-type contact layer. On the exposed part of the n-type $Al_{0.62}Ga_{0.38}N$ layer, an n-type ohmic electrode was vapor-deposited in the same manner as in Example 1, and was then formed into a toroidal shape (outer diameter: 120 μm, inner diameter: 90 μm) as in FIGS. 4A and 4B. After the p-type ohmic electrode and the n-type ohmic electrode were simultaneously contact annealed at 450° C. in an Ar atmosphere, each pad electrode (diameter: 100 μm) like one in Example 1 was formed on each of the p-type ohmic electrode and the n-type ohmic electrode to be concentric with the ohmic electrode, thereby obtaining a III nitride semiconductor light-emitting device according to Example 5. In the thus obtained n-type electrode, part of the pad electrode is in contact with the n-type $Al_{0.62}Ga_{0.38}N$ layer in the hollow space inside the toroidal shape without the n-type ohmic electrode therebetween as illustrated in FIGS. 4A and 4B.

The conductivity properties of the III nitride semiconductor light-emitting device of Example 5 were evaluated; the forward current If was 20 mA, the forward voltage Vf was 4.52 V, and the light output power Po was 2.2 mW. Thus, favorable conductivity properties were achieved. In addition, poor contact in wire bonding was not observed.

Reference Experimental Examples

A first metal layer, a second metal layer, a third metal layer, and a fourth metal layer were sequentially formed in the same manner as in Examples 1 to 3 and were then contact annealed at 450° C. thereby forming an n-type ohmic electrode. After that, a pad electrode was formed. Thus, n-type electrodes of the Reference Examples 1 to 3 were obtained. Note that each n-type ohmic electrode was formed into a circular cylindrical shape unlike the toroidal shape in Example 5.

Figure 10:
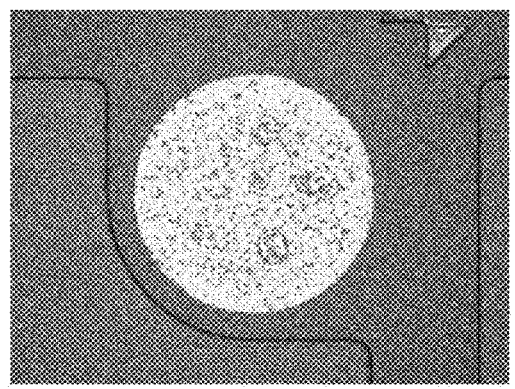
FIG. 10 is a micrograph illustrating an n-type ohmic electrode of Reference Example 1.
Figure 11:
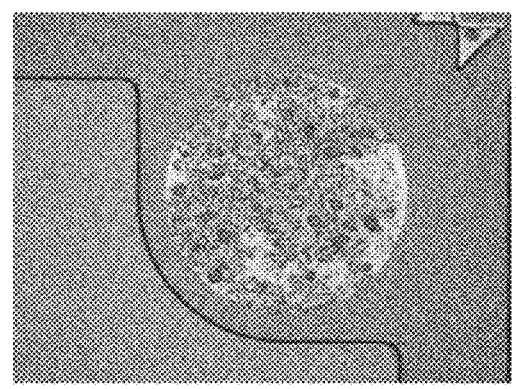
FIG. 11 is a micrograph illustrating an n-type ohmic electrode of Reference Example 2.
Figure 12:
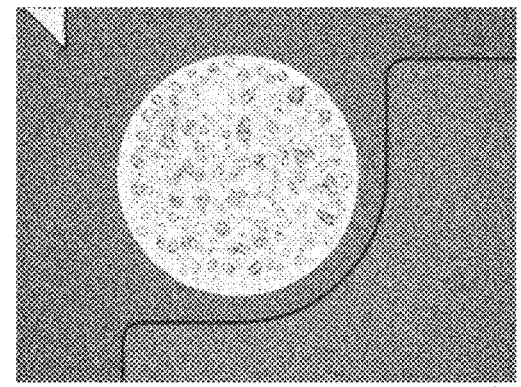
FIG. 12 is a micrograph illustrating an n-type ohmic electrode of Reference Example 3.

Each n-type ohmic electrode of Reference Examples 1 to 3 was imaged in a state corresponding to the state before the pad electrode was formed. The images of the n-type ohmic electrodes according to Reference Examples 1 to 3 are presented in FIG. 10 to FIG. 12, respectively. As presented in FIG. 10 to FIG. 12, in each of Reference Examples 1 to 3, irregular bumps were observed to be scattered. Irregular bumps were also observed on a surface of a pad electrode formed in the like manner as in Example 1 on each n-type ohmic electrode of Reference Examples 1 to 3. Further, when wire bonding was performed in Reference Examples 1 to 3, a poor contact was observed. This suggests that in order to achieve good wire bonding characteristics in Reference Experimental Examples, additional steps such as surface flattening and the formation of another metal layer under the bonding region are required.

INDUSTRIAL APPLICABILITY

According to this disclosure, a method of producing an n-type ohmic electrode that can form a good ohmic contact with an n-type $Al_xGa_{1-x}N$ (0.5≤x≤1) layer can be provided. Further, an n-type ohmic electrode that can form a good ohmic contact, and an n-type ohmic electrode and an n-type electrode which use the n-type ohmic electrode can also be provided.

REFERENCE SIGNS LIST

1: Substrate
2: Buffer
3: N-type III-nitride semiconductor layer
4: Light emitting layer
5: P-type III-nitride semiconductor layer
6a, 6b: Ohmic electrode
7a, 7b: Pad electrode
10: N-type ohmic electrode
11: First metal layer
12: Second metal layer
13: Third metal layer
14: Fourth metal layer
20: Pad electrode
30: N-type $Al_xGa_{1-x}N$ (0.5≤x≤1) layer

The invention claimed is:

1. A method of producing an n-type ohmic electrode, comprising:
   a first step of forming a first metal layer made of one of Ti and Hf on a surface of an n-type $Al_xGa_{1-x}N$ layer, where x satisfies 0.5≤x≤1;
   a second step of forming a second metal layer made of Sn on a surface of the first metal layer;
   a third step of forming a third metal layer made of one of V and Mo on a surface of the second metal layer;
   a fourth step of forming a fourth metal layer made of Al on a surface of the third metal layer; and
   a fifth step of performing heat treatment on the first metal layer, the second metal layer, the third metal layer, and the fourth metal layer,
   wherein the third metal layer allows diffusion of Al from the fourth metal layer to the second metal layer and suppresses diffusion of Sn from the second metal layer to the fourth metal layer.

2. The method of producing an n-type ohmic electrode, according to claim 1, wherein the heat treatment in the fifth step is performed at 450° C. or more and 600° C. or less.

3. An n-type ohmic electrode provided in contact with an n-type $Al_xGa_{1-x}N$ layer, where x satisfies 0.5≤x≤1, comprising an alloy including:
   a first metal layer made of one of Ti and Hf, formed on the n-type $Al_xGa_{1-x}N$ layer;
   a second metal layer made of Sn, formed on the first metal layer;

a third metal layer made of one of V and Mo, formed on the second metal layer; and a fourth metal layer made of Al, formed on the third metal layer, wherein the third metal layer allows diffusion of Al from the fourth metal layer to the second metal layer and suppresses diffusion of Sn from the second metal layer to the fourth metal layer.

4. An n-type electrode comprising: the n-type ohmic electrode according to claim 3 and a pad electrode at least provided on the n-type ohmic electrode, wherein the n-type electrode is sectioned into a contact region and a bonding region other than the contact region, part of the pad electrode in the contact region is provided on the n-type $Al_xGa_{1-x}N$ layer with the n-type ohmic electrode therebetween, and part of the pad electrode in the bonding region is provided on the n-type $Al_xGa_{1-x}N$ layer without the n-type ohmic electrode therebetween.

5. A III nitride semiconductor light-emitting device comprising the n-type electrode according to claim 4.

6. The n-type electrode according to claim 4, wherein part of the pad electrode in the bonding region is provided directly on the n-type $Al_xGa_{1-x}N$ layer.

* * * * *